United States Patent
Scholtes-Van Eijk et al.

(10) Patent No.: US 11,275,313 B2
(45) Date of Patent: Mar. 15, 2022

(54) METROLOGY APPARATUS WITH RADIATION SOURCE HAVING MULTIPLE BROADBAND OUTPUTS

(71) Applicant: ASML Netherlands B.V., Veldhoven (NL)

(72) Inventors: Paul William Scholtes-Van Eijk, Veldhoven (NL); Ronald Franciscus Herman Hugers, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/213,983

(22) Filed: Mar. 26, 2021

(65) Prior Publication Data

US 2021/0240088 A1     Aug. 5, 2021

Related U.S. Application Data

(63) Continuation of application No. 16/789,816, filed on Feb. 13, 2020, now Pat. No. 10,990,021.

(30) Foreign Application Priority Data

Feb. 15, 2019    (EP) ..................................... 19157342

(51) Int. Cl.
     *G03F 7/20*          (2006.01)

(52) U.S. Cl.
CPC ........ *G03F 7/70625* (2013.01); *G03F 7/7085* (2013.01); *G03F 7/70641* (2013.01); *G03F 7/70683* (2013.01)

(58) Field of Classification Search
CPC .............. G01N 21/474; G03F 7/70641; G03F 7/70191; G03F 7/70625; G03F 7/70683; G03F 7/7085

(Continued)

(56) References Cited

U.S. PATENT DOCUMENTS

| 6,952,253 B2 | 10/2005 | Lof et al. |
| 6,961,116 B2 | 11/2005 | Den Boef et al. |

(Continued)

FOREIGN PATENT DOCUMENTS

| EP | 1 628 164 A2 | 2/2006 |
| WO | WO 2009/106279 A1 | 9/2009 |

(Continued)

OTHER PUBLICATIONS

International Search Report and Written Opinion of the International Searching Authority directed to related International Patent Application No. PCT/EP2020/051083, dated May 12, 2020; 13 pages.

(Continued)

*Primary Examiner* — Hung Nguyen

(74) *Attorney, Agent, or Firm* — Sterne, Kessler, Goldstein & Fox P.L.L.C.

(57) ABSTRACT

Disclosed is a metrology apparatus for use in a lithographic manufacturing process. The metrology apparatus comprises a radiation source comprising a drive laser having an output split into a plurality of optical paths, each comprising a respective broadband light generator. The metrology apparatus further comprises illumination optics for illuminating a structure, at least one detection system for detecting scattered radiation, having been scattered by the structure and a processor for determining a parameter of interest of the structure from the scattered radiation.

12 Claims, 5 Drawing Sheets

(58) Field of Classification Search
USPC .............................................. 355/52, 53, 55
See application file for complete search history.

(56) References Cited

U.S. PATENT DOCUMENTS

| | | | |
|---|---|---|---|
| 7,265,364 | B2 | 9/2007 | Teunissen et al. |
| 7,646,471 | B2 | 1/2010 | Teunissen et al. |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 9,160,137 | B1 | 10/2015 | Abdolvand et al. |
| 10,693,271 | B2 | 6/2020 | Uebel et al. |
| 10,990,021 | B2 * | 4/2021 | Scholtes-Van Eijk ............. G03F 9/7065 |
| 2005/0185683 | A1 | 8/2005 | Ohtsuki |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0141730 | A1 | 6/2013 | Quintanilba |
| 2013/0162996 | A1 | 6/2013 | Straaijer et al. |
| 2015/0042999 | A1 | 2/2015 | Quintanilba |
| 2015/0261097 | A1 | 9/2015 | Mathijssen et al. |
| 2016/0161863 | A1 | 6/2016 | Den Boef et al. |
| 2016/0370717 | A1 | 12/2016 | Den Boef et al. |
| 2017/0176328 | A1 | 6/2017 | Jak et al. |
| 2017/0184981 | A1 | 6/2017 | Quintanilha et al. |
| 2020/0264521 | A1 | 8/2020 | Scholtes-Van Eijk et al. |

FOREIGN PATENT DOCUMENTS

| | | |
|---|---|---|
| WO | WO 2016/102127 A1 | 6/2016 |
| WO | WO 2017/211694 A1 | 12/2017 |
| WO | WO 2018/127266 A1 | 7/2018 |
| WO | WO 2018/192723 A1 | 10/2018 |

OTHER PUBLICATIONS

Non-Final Rejection directed to U.S. Appl. No. 16/789,816, dated Aug. 27, 2020; 7 pages.

Notice of Allowance directed to U.S. Appl. No. 16/789,816, dated Dec. 21, 2020; 6 pages.

* cited by examiner

METROLOGY APPARATUS WITH RADIATION SOURCE HAVING MULTIPLE BROADBAND OUTPUTS

CROSS-REFERENCE TO RELATED APPLICATIONS

This application is a continuation application of U.S. patent application Ser. No. 16/789,816, filed on Feb. 13, 2020, which claims priority to European Patent Application 19157342.7, filed on Feb. 15, 2019, the entire contents of all of which are incorporated herein by references.

FIELD

The present invention relates to a metrology device for performing measurements as part of a lithographic manufacturing process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD=k_1 \times \lambda/NA$, where $\lambda$, is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure, leveling tools to measure a surface topology of the substrate, for e.g., focus control and scatterometry based tools for inspecting/measuring the exposed and/or etched product in process control. In each case, a radiation source is required. Where multiple sensors are provided, multiple radiation sources are desirable.

SUMMARY

It would be desirable to implement multiple broadband radiation sources in a more efficient manner.

The invention provides a metrology apparatus for use in a lithographic manufacturing process; comprising: a radiation source comprising a drive laser having an output split into a plurality of optical paths, each comprising a respective broadband light generator, the broadband light generator comprising a gas-filled hollow core photonic crystal fiber for generating broadband radiation; illumination optics for illuminating a structure on a substrate with radiation from said radiation source; at least one detection system for detecting scattered radiation, having been scattered by the structure; and a processor for determining a parameter of interest of the structure from the scattered radiation.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
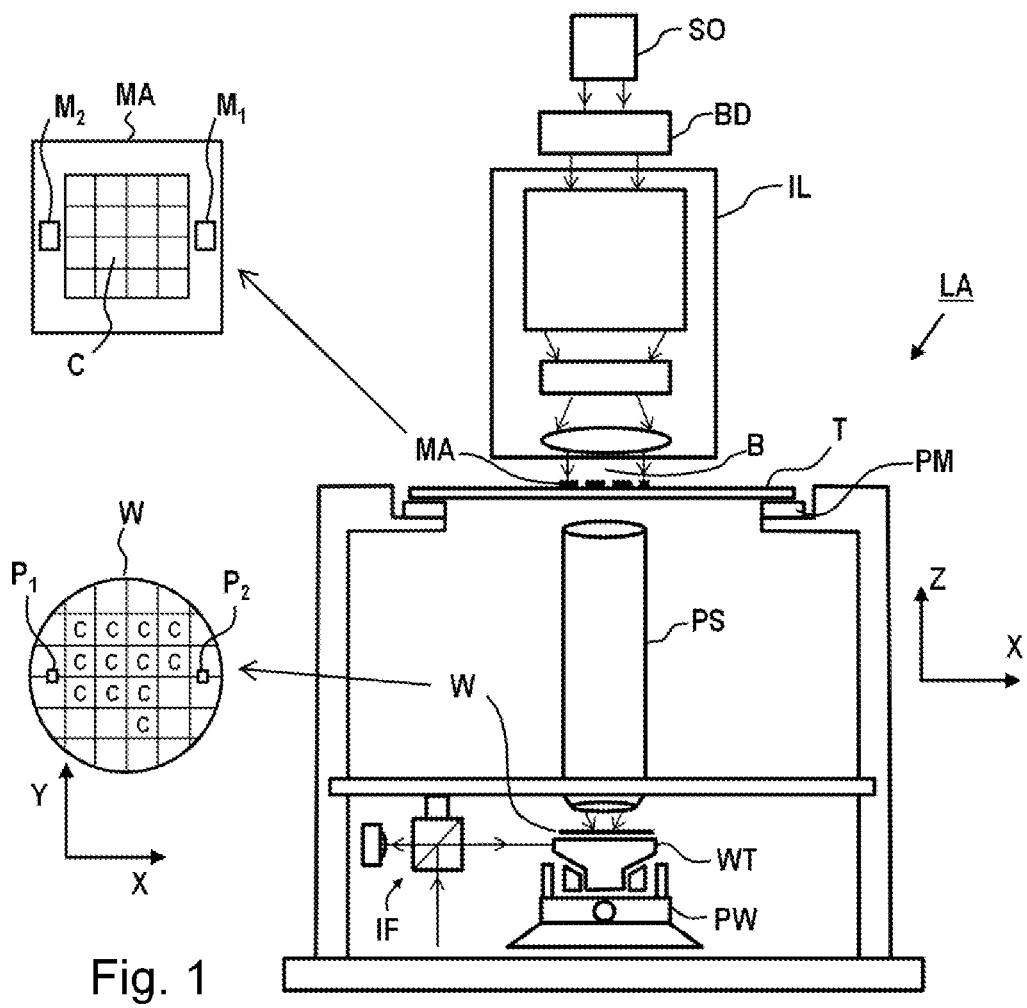
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
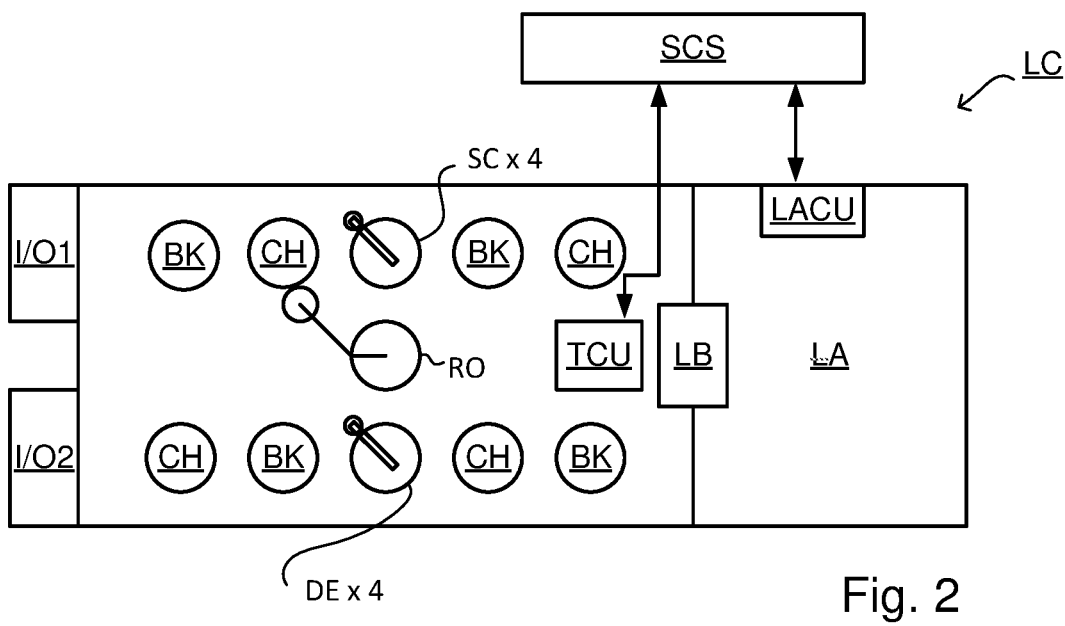
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
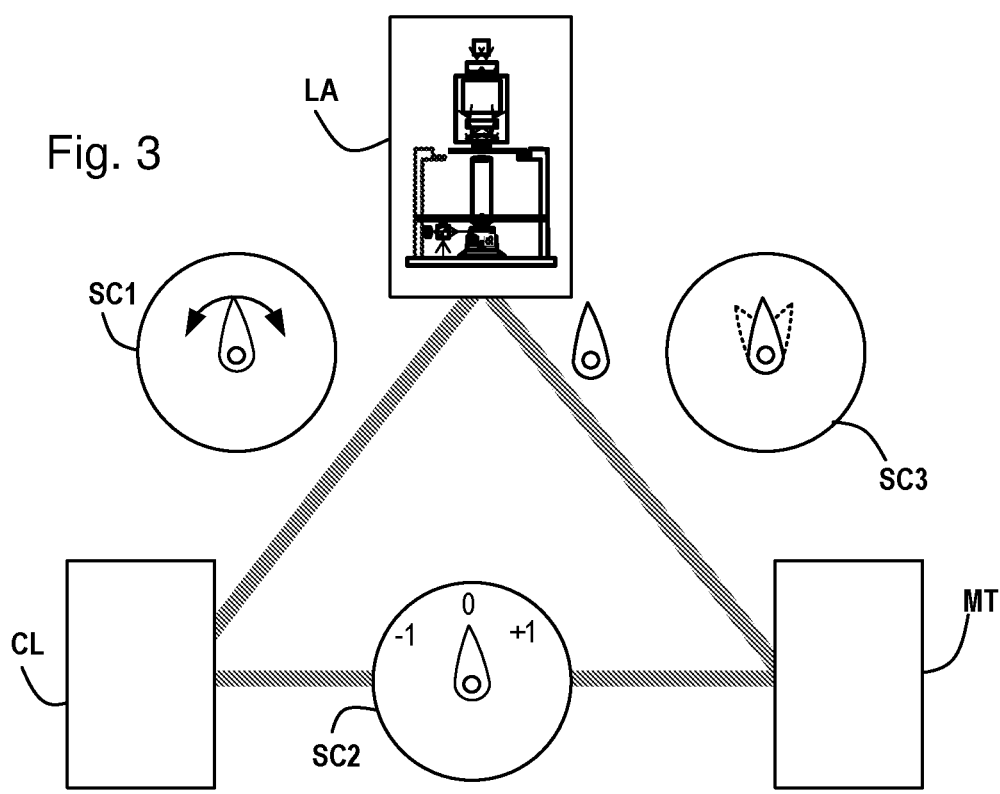
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

Figure 4:
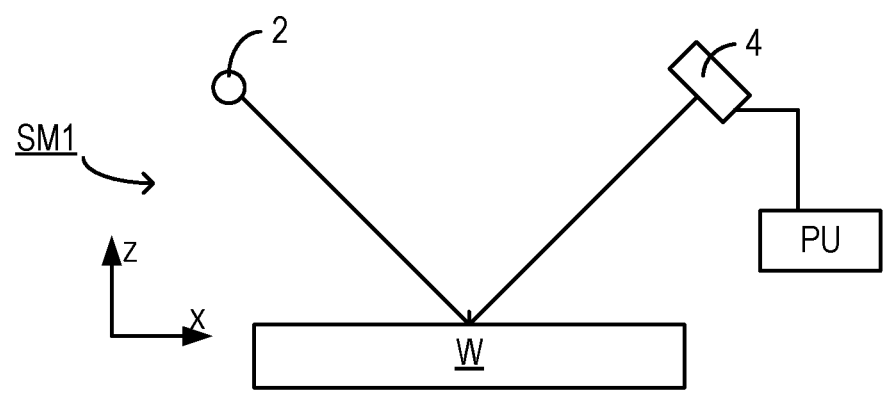
FIG. 4 depicts a schematic overview of a scatterometry apparatus used as a metrology device, which may comprise a radiation source according to embodiments of the invention.
Figure 4:
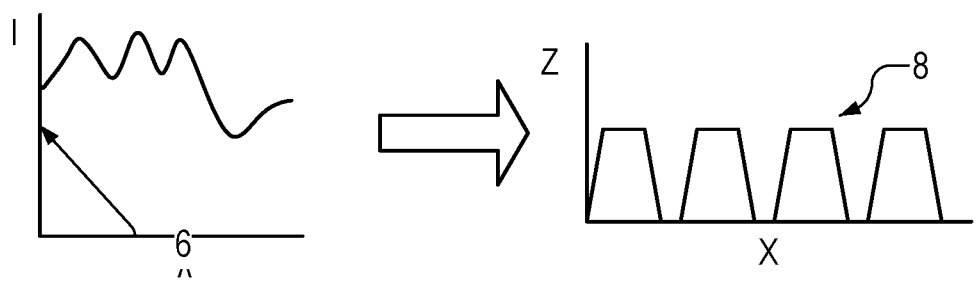

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016/0161863 and published US patent application US 2016/0370717A1 incorporated herein by reference in its entirety.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
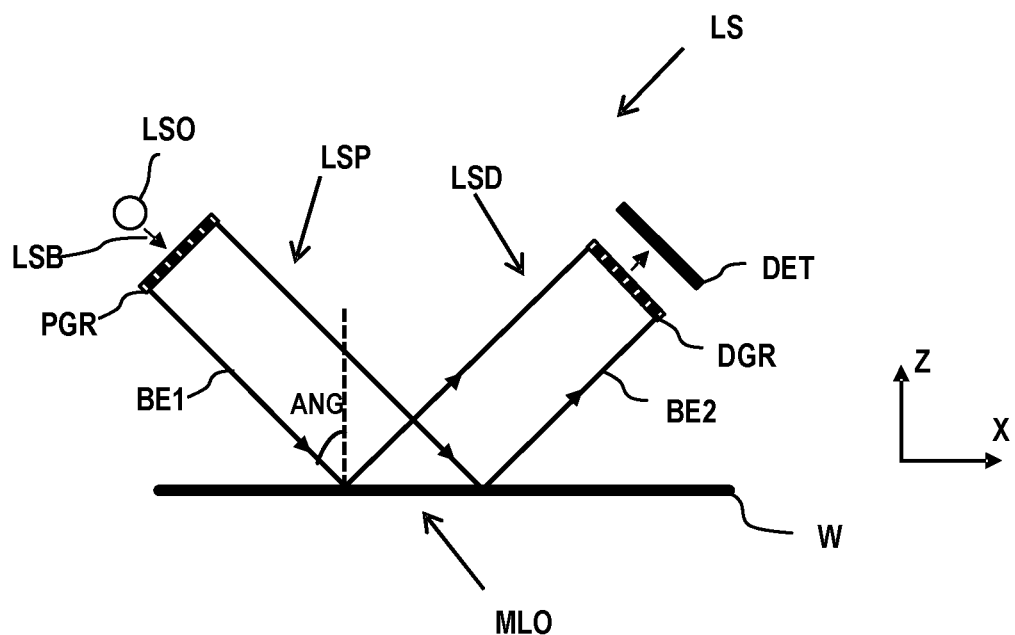
FIG. 5 depicts a schematic overview of a level sensor apparatus which may comprise a radiation source according to embodiments of the invention.

An example of a level or height sensor LS as known in the art is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Another type of metrology tool used in IC manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

Figure 6:
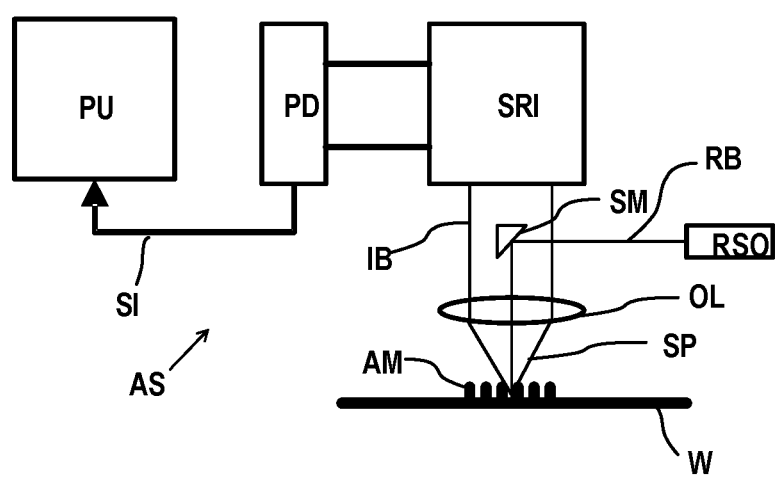
FIG. 6 depicts a schematic overview of an alignment sensor apparatus which may comprise a radiation source according to embodiments of the invention.

FIG. 6 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

All of the metrology tools and systems described above may use a white or broadband light radiation source generated from a narrow band drive laser. This may be achieved by arranging the drive laser to drive a supercontinuum generator such as a supercontinuum fiber. Presently, one drive laser is used to drive one supercontinuum fiber. If a metrology tool or process requires two distinct broad spectra to be generated from one source, this is typically not possible. Such a requirement generally requires two drive lasers and two fibers, at significant cost.

To address this, a metrology tool or apparatus is proposed which comprises a radiation source comprising at least one drive laser having its output split into multiple paths, each path comprising a white light generator or, more generally, a broadband light generator (which could, for example, generate a broadband spectrum in infra-red). The broadband light generator may comprise a fiber to generate broadband light. In another example, the broadband light generator may comprise a supercontinuum generator, such as a supercontinuum fiber. The supercontinuum generators may each have different properties, resulting in two or more different distinct spectra. In alternative embodiments, the supercontinuum generators are similar, and output similar spectra.

Such a metrology tool will further comprise illumination optics for illuminating a structure on a substrate with radiation, detection optics for detecting scattered radiation, having been scattered by the structure and a processor for determining a parameter of interest of the structure from the scattered radiation. As such, the metrology tool may be any of the tools illustrated and described in relation to FIGS. 4 to 6 (e.g., scatterometer tool, level sensor/height sensor tool and/or alignment sensor tool). The radiation sources described herein may replace any of the sources 2, LSO, RSO illustrated in FIGS. 4, 5 and 6 respectively.

Figure 7:
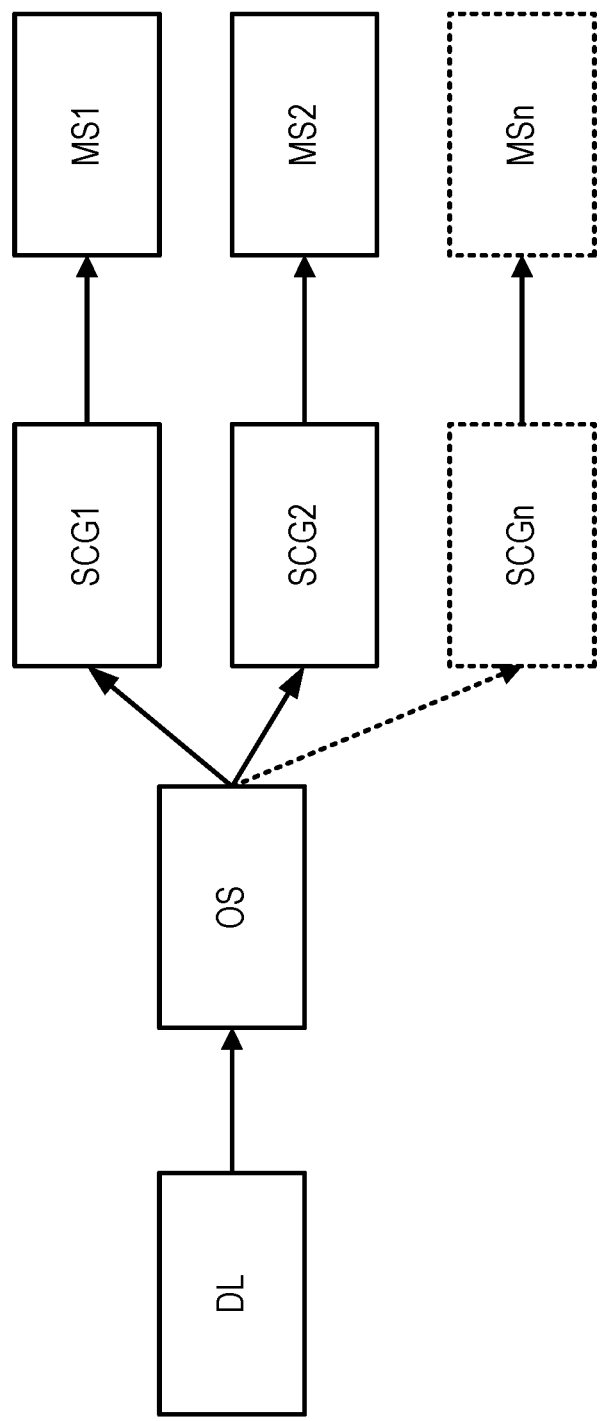
FIG. 7 depicts a schematic overview of a radiation source according to embodiments of the invention.

FIG. 7 illustrates such radiation source. The output of a drive laser DL is divided into two or more optical paths using a suitable optical switch OS or other suitable optical component. Each optical path comprises a separate supercontinuum generator SCG1, SG2, SGn such as a supercontinuum fiber. The output of each supercontinuum generator is then used as a source for a metrology sensor or metrology system MS1, MS2, MSn. Alternatively, each of the sources defined by the output of a supercontinuum generator is used by the same single metrology system, to make (e.g., parallel) measurements with different illumination characteristics.

The optical switch OS may comprise a fast optical switch such as, for example, an acousto-optic modulator or Acoustic Optical Module AOM, a mechanical flipping mirror or mechanically flipping between suitable filters. The choice of the optical switch is mainly dependent on the required speed for switching. An AOM can switch in micro-second range, while a mechanical switch typically takes >20 ms.

Alternatively, optical switch OS may comprise an electro-optical modulator (EOM). EOMs are also very fast switching, and could, (for example, in combination with the pulsed drive laser), allow for parallel operation of the multiple broadband light generators at a lower pulse frequency, rather than the serial switching embodiments mentioned above.

As an alternative, the optical component OS may comprise a beam splitter to split the drive laser DL radiation output. This would require a significantly more powerful driver laser DL, but could also allow for parallel use of the supercontinuum generators.

A fiber-based beam splitter implementation is possible, where one input fiber (connected to the drive laser) connects to two or more output fibers, each connecting to a respective supercontinuum fiber. Again, this would need a higher power drive laser DL than the serial examples.

Another option for the optical switch OS is a Micro-Electro-Mechanical System (MEMS) device comprising an array (e.g. a large array) of flipping mirrors, where the beam from the drive laser is reflected in one, or even multiple, directions.

A further example for the optical component OS is a diffracting element, e.g. a grating. In such an embodiment, different diffraction orders may each define a respective optical path (e.g., a grating can be designed such that approximately the amount of light is present in each of the 0th, −1, +1 diffraction orders).

The optical component OS may comprise several wedge shaped optical elements placed in the path of the drive laser beam, to refract sub-beams into different directions defining the two or more optical paths.

To ensure the light output from the drive laser, via optical switch OS, enters each supercontinuum generator correctly, the light beam should be properly aligned. This may be achieved via suitable beam steering. If the two (or more) supercontinuum generator are sufficiently physically close to each other, a common beam steering functionality/apparatus can be used to guide the light from the driver laser (or optical switch) to each supercontinuum generator.

The above embodiment focusses on a serial use of the drive laser light output by respective supercontinuum generators; for example to derive two or more different spectra using a supercontinuum generator with different properties in each optical path. Such an embodiment may comprise fewer than 10, fewer than 5, or only 2 or 3 optical paths.

It is expected that some metrology tools will comprise, at least in future, parallel sensors or detectors. Such parallel sensors may comprise only two or a few parallel sensors, but may also comprise larger arrays of sensors. For example, a parallel array of 10×10 sensors can be envisaged, wherein each sensor receives the same spectra (illumination characteristics). For such a system, it would be very difficult to generate all the required broadband light in one fiber and subsequently split the generated light beam into 100 sub-beams, as it is difficult to generate such high powers of white light.

In such an embodiment, each sensor (or one or more subsets of the sensors) of sensors may be provided with radiation via a respective supercontinuum generator. All of these supercontinuum generators may be similar to provide multiple same spectra, or else one or more of them may each be different to provide one or more different spectra within the array. Other embodiment may use multiple laser sources to provide sufficient power (e.g., two drive lasers, each driving half of the supercontinuum generators). The number of supercontinuum generators could be reduced (e.g., halved) if the output of each one is split into two or more. Obviously, the 10×10 array is purely an example, and an array of any number, arranged in any manner is possible.

Figure 8A:
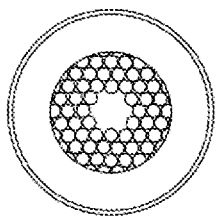
FIGS. 8(a)-8(c) depict examples of supercontinuum fibers to generate broadband radiation.
Figure 8B:
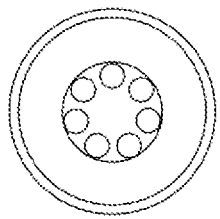
Figure 8C:
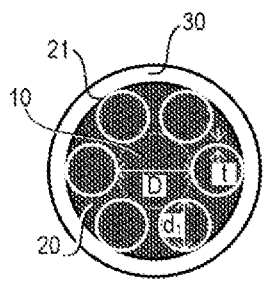

FIGS. 8(a) to (c) depict in cross-sections, a number of examples of fiber that can be used to generate broadband radiation or supercontinuum radiation. FIGS. 8(a) to (c) schematically show cross-sections of supercontinuum fibers, and more specifically Hollow Core Photonic Crystal Fiber (HC-PCF). The hereinafter discussed examples of HC-PCF may be examples of broadband light generators, supercontinuum fibers or a fibers to generate broadband light is discussed.

FIG. 8(a) shows a Kagome fiber, comprising a Kagome lattice structure. FIG. 8(b) shows a single-ring or revolver fibers, where the hollow core region is formed and surrounded by a layer of non-touching rings.

FIG. 8(c) shows transverse cross-sections of another practical example of a HC-PCFs. The circles represent the solid material of the anti-resonant elements (AREs) or outer cladding region, like quartz glass or silica, while the shaded portions are free of solid materials (evacuated or filled with gas or liquid). The HC-PCF comprises a hollow core region 10 (represented in FIG. 7(c) by a dotted circle), an inner cladding region 20 with multiple anti-resonant elements (AREs) 21 and an outer cladding region 30. The hollow core region 10 is the empty space, between the AREs 21, extending along the longitudinal length of the HC-PCF and having a smallest transverse core dimension D. The AREs 21 of the inner cladding region 20 may comprise capillaries having a wall thickness t and a smallest transverse ARE dimension d. The AREs 21 may be fixed to the inner surface of the outer cladding region 30. The outer cladding region 30 may comprise a larger capillary being made of e.g. glass and providing a closed cladding of the HC-PCF. The HC-PCF of FIG. 8(c) illustrates an embodiment wherein the AREs 21 comprise a single-ring of six thin-wall capillaries with a circular transverse cross-section arranged within the larger capillary of the outer cladding region 30 in six-fold symmetric pattern so as to create a central hollow core of diameter D (the shortest distance between diametrically opposite AREs 21). In the example of FIG. 8(c) the AREs do not touch each other.

The examples of inventive HC-PCFs as shown in FIG. 8(c) can be modified, in particular with regard to the number of the AREs 21. The AREs may number 4 or 5 or 7 or more, for example. The ARE arrangement may be varied in a number of other ways. Each ARE 21 may have e.g., an elliptic or polygonal cross-section; the inner shape of the outer cladding 30 may have e. g. a polygonal cross-section; and the solid materials of the AREs 21, may comprise e.g., plastic material, like PMA, glass, like silica, or soft-glass. In other examples, the diameter of the AREs may be selected such that the AREs touch each other.

For gas-based white light generation, a HC-PCF may be comprised within a gas cell, which is designed to operate, for example, at a pressure up to many 10s of bars (e.g., between up to 100 bar). A gas-filled HC-PCF can act as an optical frequency converter when being pumped by an ultrashort pump laser pulse with sufficient peak power. The frequency conversion from ultrashort pump laser pulses to broadband laser pulses is enabled by a complicated interplay of the dispersion and nonlinear optical processes inside the gas-filled fiber. The converted laser pulses are predominantly confined within the hollow core in the form of transverse core modes and guided to the fiber end. Part of the radiation, for example higher order transverse core modes or specific wavelengths, may leak from the hollow core through the inner cladding waveguide structure and undergoes strong attenuation during its propagation along the fiber. The core region and the cladding region of a HC-PCF can be configured such that the higher order core modes are phase matched to the higher order cladding modes.

The spatio-temporal transmission characteristics of a laser pulse, e.g. its spectral amplitude and phase, transmitted along a HC-PCF can be varied and tuned through adjustment of pump laser parameters, filling gas parameters and fiber parameters. Said transmission characteristics may include one or more of: output power, output mode profile, output temporal profile, width of the output temporal profile (or output pulse width), output spectral profile, and bandwidth of the output spectral profile (or output spectral bandwidth). Said pump laser parameters may include one or more of: pump wavelength, pump pulse energy, pump pulse width, pump pulse repetition rate or pump pulse shape. Said fiber parameters may include one or more of: fiber length, size and shape of the hollow core, size and shape of the cladding structure (or capillary number), thickness of the walls surrounding the hollow core. Said filling gas parameters may include one or more of: gas type, gas pressure and gas temperature. The parameters of fiber and/or gas by also undergo changes along the fiber, e.g. the fiber could be tapered or there could be a gas gradient.

The filling gas can be a noble gas such as Argon, Krypton, and Xenon, a Raman active gas such as Hydrogen, Deuterium and Nitrogen, or a gas mixture such as an Argon/Hydrogen mixture, a Xenon/Deuterium mixture, a Krypton/Nitrogen mixture, or a Nitrogen/Hydrogen mixture. Depending on the type of filling gas, the nonlinear optical processes can include modulational instability (MI), soliton fission, Kerr effect, Raman effect and dispersive wave generation, details of which are described in WO2018/127266A1 and U.S. Pat. No. 9,160,137B1 (both of which are hereby incorporated by reference). Since the dispersion of the filling gas can be tuned by varying the gas cell pressure, the generated broadband pulse dynamics and the associated spectral broadening characteristics can be adjusted so as to optimize the frequency conversion. The generated broadband laser output can cover wavelengths from UV (e.g., <200 nm) to mid-IR (e.g., >2000 nm). An output spectrum of a gas-filled HC-PCF can be tuned by selecting specific combinations of the above discussed parameters and the types of gas-fillings.

In an embodiment, a metrology tool may comprise a plurality of illumination optics, such that respective illumination optics are provided in each optical path.

Further embodiments are disclosed in the subsequent numbered clauses:

1. A metrology apparatus for use in a lithographic manufacturing process, comprising:

a radiation source comprising a drive laser having an output split into a plurality of optical paths, each comprising a respective broadband light generator;

illumination optics for illuminating a structure on a substrate with radiation from said radiation source;

at least one detection system for detecting scattered radiation, having been scattered by the structure; and a processor for determining a parameter of interest of the structure from the scattered radiation.

2. A metrology apparatus as defined in clause 1, wherein each of said broadband light generators comprises a supercontinuum generator.

3. A metrology apparatus as defined in clause 2, wherein each of said supercontinuum generators comprises a supercontinuum fiber, and, optionally, the supercontinuum fiber being a hollow core photonic crystal fiber.

4. A metrology apparatus as defined in any preceding clause, wherein at least two of said broadband light generators each comprise a different output property, such that the output spectra of radiation generated is different.

5. A metrology apparatus as defined in clause 4, wherein all of said broadband light generators each comprise a different output property, such that the output spectra of radiation generated is different 6. A metrology apparatus as defined in any of clauses 1 to 3, wherein at least two of said broadband light generators are similar, such that the output spectra of radiation generated is similar.

7. A metrology apparatus as defined in clause 6, wherein said broadband light generators are all similar, such that the output spectra of radiation generated by each one is similar.

8. A metrology apparatus as defined in any preceding clause, operable to provide serial output wherein output of the drive laser is serially split using an optical switching device.

9. A metrology apparatus as defined in clause 8, wherein the optical switching device comprises one of an acousto-optic modulator, electro-optic modulator, MEMS device, flipping mirror device or filter switching device.

10. A metrology apparatus as defined in clause 8 or 9, wherein the optical switching device splits the drive laser into fewer than five optical paths, each comprising a respective broadband light generator.

11. A metrology apparatus as defined in clause 10, wherein the optical switching device splits the drive laser into two optical paths, each comprising a respective broadband light generator.

12. A metrology apparatus as defined in any of clauses 1 to 7, operable to provide parallel output wherein output of the drive laser is split in parallel using an optical splitting device or optical switching device.

13. A metrology apparatus as defined in clause 12, wherein said drive laser comprises a pulsed drive laser and the output of the drive laser is split using an optical switching device, thereby providing for said parallel output at a lower pulse frequency than said pulsed drive laser.

14. A metrology apparatus as defined in clause 12 or 13, wherein the optical switching device comprises an electro-optic modulator or MEMS device.

15. A metrology apparatus as defined in clause 12, wherein the output of the drive laser is split using an optical splitting device comprising one or more of: an optical beam splitter, a fiber based beam splitter, a diffraction element or a plurality of optical wedges.

16. A metrology apparatus as defined in any of clauses 12 to 15, wherein the optical splitting device or optical switching device splits the drive laser into fewer than five optical paths each comprising a respective broadband light generator.

17. A metrology apparatus as defined in any of clauses 12 to 15, wherein the optical splitting device or optical switching device splits the drive laser into more than 10 of said optical paths each comprising a respective broadband light generator.

18. A metrology apparatus as defined in any preceding clause, wherein, for each optical path, a separate detector is provided within the detection system, or a separate detection system is provided.

19. A metrology apparatus as defined any of clauses 1 to 17, wherein radiation in at least some of said optical paths is detected by a common detector and/or detection system.

20. A metrology apparatus as defined in any preceding clause, wherein separate of said illumination optics are provided for each optical path.

21. A metrology apparatus as defined in any preceding clause, comprising a common beam steering arrangement to guide the radiation from the driver laser to each broadband light generator.

22. A metrology apparatus as defined in any preceding clause, wherein the metrology apparatus comprises a scatterometer metrology apparatus, a level sensor or an alignment sensor.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A metrology system for use in a lithographic manufacturing process, the metrology system comprising:
   a radiation source comprising a drive laser having an output split into a plurality of optical paths; and
   a plurality of metrology apparatuses comprising
      a respective one of a plurality of optical paths, each comprising a respective broadband light generator, the broadband light generator comprising a gas-filled hollow core photonic crystal fiber configured to generate broadband radiation;
      illumination optics configured to illuminate a structure on a substrate with radiation from the respective broadband light generator;
      a detection system configured to detect scattered radiation, having been scattered by the structure; and
      a processor configured to determine a parameter of interest of the structure based on the scattered radiation, wherein the metrology system is configured to split the output of the drive laser in parallel using an optical splitting device or an optical switching device and the respective broadband generators are operable in parallel to provide parallel output of the plurality of metrology apparatuses.

2. The metrology system of claim 1, wherein each of the broadband light generators comprises a supercontinuum generator.

3. The metrology system of claim 1, wherein at least two of the broadband light generators each comprise a different output property, such that a respective output spectra of radiation generated by the at least two broadband light generators is different.

4. The metrology system of claim 1, wherein at least two of the broadband light generators each comprise a similar output property, such that a respective output spectra of radiation generated by the at least two broadband light generators is similar.

5. The metrology system of claim 1, wherein the optical splitting device or the optical switching device comprises one of an acousto-optic modulator, an electro-optic modulator, a MEMS device, a flipping mirror device or a filter switching device.

6. The metrology system of claim 1, wherein the driver laser comprises a pulsed drive laser and the output of the drive laser is split using an optical switching device, thereby providing for the parallel output at a lower pulse frequency than the pulsed drive laser.

7. The metrology system of claim 1, wherein the optical switching device comprises one or more of: an electro-optic modulator or MEMS device, an optical beam splitter, a fiber based beam splitter, a diffraction element or a plurality of optical wedges.

8. The metrology system of claim 1, wherein one of:
   the optical splitting device or optical switching device splits the drive laser into fewer than five optical paths;
   the optical splitting device or optical switching device splits the drive laser into two optical paths; or
   the optical splitting device or optical switching device splits the drive laser into more than 10 optical paths.

9. The metrology system of claim 1, wherein each of the broadband light generators comprises a hollow core photonic crystal fiber.

10. The metrology system of claim 9, wherein each hollow core photonic crystal fiber comprises a gas filling.

11. The metrology system of claim 1, comprising a common beam steering arrangement to steer the beam of radiation from the driver laser to each broadband light generator.

12. The metrology system of claim 1, further comprising a scatterometer metrology apparatus and a level sensor or an alignment sensor.

* * * * *

UNITED STATES PATENT AND TRADEMARK OFFICE
CERTIFICATE OF CORRECTION

| | |
|---|---|
| PATENT NO. | : 11,275,313 B2 |
| APPLICATION NO. | : 17/213983 |
| DATED | : March 15, 2022 |
| INVENTOR(S) | : Scholtes-Van Eijk et al. |

It is certified that error appears in the above-identified patent and that said Letters Patent is hereby corrected as shown below:

On the Title Page

In item (*) Notice, please add --This patent is subject to a terminal disclaimer--.

In item (45) Date of Patent, please replace "Mar. 15, 2022" with --*Mar. 15, 2022--.

In the Claims

In Column 15, Line 26, please replace "a plurality of metrology apparatuses comprising" with --a plurality of metrology apparatuses comprising:--.

Signed and Sealed this
Twenty-fourth Day of May, 2022

*Katherine Kelly Vidal*

Katherine Kelly Vidal
*Director of the United States Patent and Trademark Office*